United States Patent
Jung

(10) Patent No.: US 7,336,534 B2
(45) Date of Patent: Feb. 26, 2008

(54) NON-VOLATILE MEMORY DEVICE AND DRIVE METHOD THEREOF

(75) Inventor: Jin Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,468

(22) Filed: Dec. 30, 2004

(65) Prior Publication Data

US 2005/0141272 A1    Jun. 30, 2005

(30) Foreign Application Priority Data

Dec. 31, 2003  (KR) .............. 10-2003-0101950

(51) Int. Cl.
*G11C 11/34* (2006.01)
(52) U.S. Cl. .............. 365/185.08; 365/185.26
(58) Field of Classification Search .............. 365/154, 365/185.01, 185.07, 185.08, 185.26
See application file for complete search history.

(56) References Cited

U.S. PATENT DOCUMENTS

| | | | | |
|---|---|---|---|---|
| 5,065,362 A | * | 11/1991 | Herdt et al. ............. | 365/154 |
| 5,682,345 A | * | 10/1997 | Roohparvar et al. ... | 365/185.04 |
| 5,892,712 A | * | 4/1999 | Hirose et al. .......... | 365/185.07 |
| 6,172,907 B1 | * | 1/2001 | Jenne ................ | 365/185.18 |
| 6,469,930 B1 | * | 10/2002 | Murray ............... | 365/185.08 |
| 6,556,487 B1 | * | 4/2003 | Ratnakumar et al. .. | 365/189.08 |
| 6,965,145 B2 | * | 11/2005 | Choi .................... | 257/326 |
| 6,965,524 B2 | * | 11/2005 | Choi .................... | 365/185.08 |
| 7,054,194 B2 | * | 5/2006 | Liaw et al. ............ | 365/185.08 |
| 2005/0139902 A1 | * | 6/2005 | Jung .................... | 257/324 |
| 2005/0141266 A1 | * | 6/2005 | Jung .................... | 365/154 |
| 2005/0141267 A1 | * | 6/2005 | Kwon ................... | 365/154 |
| 2005/0142750 A1 | * | 6/2005 | Jung .................... | 438/257 |
| 2005/0142751 A1 | * | 6/2005 | Jung .................... | 438/257 |
| 2005/0162896 A1 | * | 7/2005 | Jung .................... | 365/154 |

* cited by examiner

*Primary Examiner*—Van Thu Nguyen
*Assistant Examiner*—Alexander Sofocleous
(74) *Attorney, Agent, or Firm*—Lowe Hauptman Ham & Berner LLP

(57) ABSTRACT

A non-volatile memory device and drive method thereof uses a voltage bias condition to enable an electronic device to normally operate without employing a specific transistor, e.g., a recall transistor. The non-volatile memory device performs its function normally without the recall transistor, and by which a degree of cell integration can be considerably raised. A SRAM latch is controlled by the logic circuit, a SONOS (silicon-oxide-nitride-oxide-silicon) transistor is electrically connected to a Vcc node of the electronic device to store a high/low state of the SRAM latch according to a turn-on or turn-off state of power, and a pass transistor controls read, program, and erase operations of the SONOS transistor.

8 Claims, 4 Drawing Sheets

| | Pass Tr. | SONOS Tr. | Vcc node |
|---|---|---|---|
| Electronic device on operation | 0V | 0V | F |
| Electronic device OFF — Erase | 0V | −Ve | F |
| Electronic device OFF — Program | H | Vp | F |
| Initiation of electronic device | H | 0V | H |

FIG. 3

|  | | Pass Tr. | SONOS Tr. | Vcc node |
|---|---|---|---|---|
| Electronic device on operation | | 0V | 0V | F |
| Electronic device OFF | Erase | 0V | −Ve | F |
| | Program | H | Vp | F |
| Initiation of electronic device | | H | 0V | H |

NON-VOLATILE MEMORY DEVICE AND DRIVE METHOD THEREOF

BACKGROUND OF THE INVENTION

1. Field of the Invention

The present invention relates to a non-volatile memory device and drive method thereof, in which a voltage bias condition enables an electronic device to normally operate without employing a specific transistor, e.g., a recall transistor in each memory cell, by which the non-volatile memory device can perform its function normally without the recall transistor, and by which a degree of cell integration can be considerably raised.

2. Discussion of the Related Art

FIG. 1 is a circuit diagram of a non-volatile memory device according to a related art.

Referring to FIG. 1, a conventional non-volatile memory device, e.g., nvSRAM (non-volatile static random access memory), consists of a SRAM latch 50 having four transistors 51 and 52, pass gates 40 and 41 reading/writing a high/low state formed in the SRAM latch 50, a SONOS (silicon-oxide-nitride-oxide-silicon) transistor 20 storing the high/low state of the SRAM latch 50 in case of turning off power, and pass and recall transistors 30 and 10 controlling read, program, and erase operations of the SONOS transistor 20.

However, since the related art non-volatile memory device basically consists of a multitude of transistors, it is difficult to raise a degree of integration of the non-volatile memory device. Moreover, the present inventor recognized that 12 transistors per memory cell limits the degree of integration that can be achieved.

Moreover, the difficulty in raising the integration degree puts a limitation on an overall operation of a corresponding electronic device.

SUMMARY OF THE INVENTION

Accordingly, the present invention is directed to a non-volatile memory device and drive method thereof substantially obviate the above-identified and other problems due to limitations and disadvantages of the related art.

An object of the present invention is to provide a non-volatile memory device and drive method thereof, in which a voltage bias condition enabling an electronic device to normally operate without employing in the memory cell (or each side of a dual-sided memory cell) a specific transistor, e.g., a recall transistor, by which the non-volatile memory device can perform its function normally without the recall transistor, and by which a degree of cell integration can be considerably raised.

Another object of the present invention is to provide a non-volatile memory device and drive method thereof, by which a degree of cell integration can be considerably raised to relieve an electronic device from a memory operation load.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a non-volatile memory device, which is provided within an electronic device having a logic circuit, according to the present invention includes an SRAM latch controlled by the logic circuit, a SONOS (silicon-oxide-nitride-oxide-silicon) transistor electrically connected to a Vcc node of the electronic device (without a recall transistor in each side of the cell, or without a recall transistor at all in the cell) to store a high/low state of the SRAM latch according to a turn-on or turn-off state of power, and a pass transistor controlling read, program, and erase operations of the SONOS transistor.

In another aspect of the present invention, a method of driving a non-volatile memory device, which is provided within an electronic device having a logic circuit and includes an SRAM latch controlled by the logic circuit, a SONOS (silicon-oxide-nitride-oxide-silicon) transistor electrically connected to a Vcc node of the electronic device to store a high/low state of the SRAM latch according to a turn-on or turn-off state of the electronic device, and a pass transistor controlling read, program, and erase operations of the SONOS transistor, includes the steps of erasing electrons (or charge) stored in the SONO transistor by applying a negative voltage to the SONOS transistor and a first voltage to the pass transistor and by floating the Vcc node in case the electronic device is in an off-state and selectively storing the high/low state stored in the SRAM latch by applying a positive voltage to the SONOS transistor and a positive voltage to the pass transistor and by floating the Vcc node.

Preferably, the method further includes the step of, if the electronic device is in the turn-on state, isolating the SONOS transistor from the SRAM latch by applying the first voltage to the SONOS transistor and the pass transistor and by floating the Vcc node.

Preferably, the method further includes the steps of, if the electronic device is in the turn-off state, recalling information stored in the SONOS transistor to the SRAM latch by applying the positive voltage to the Vcc node, the first voltage to the SONOS transistor, and the positive voltage to the pass transistor.

Preferably, the first voltage is a ground voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is a table for explaining a method of driving a non-volatile memory device according to the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 2:
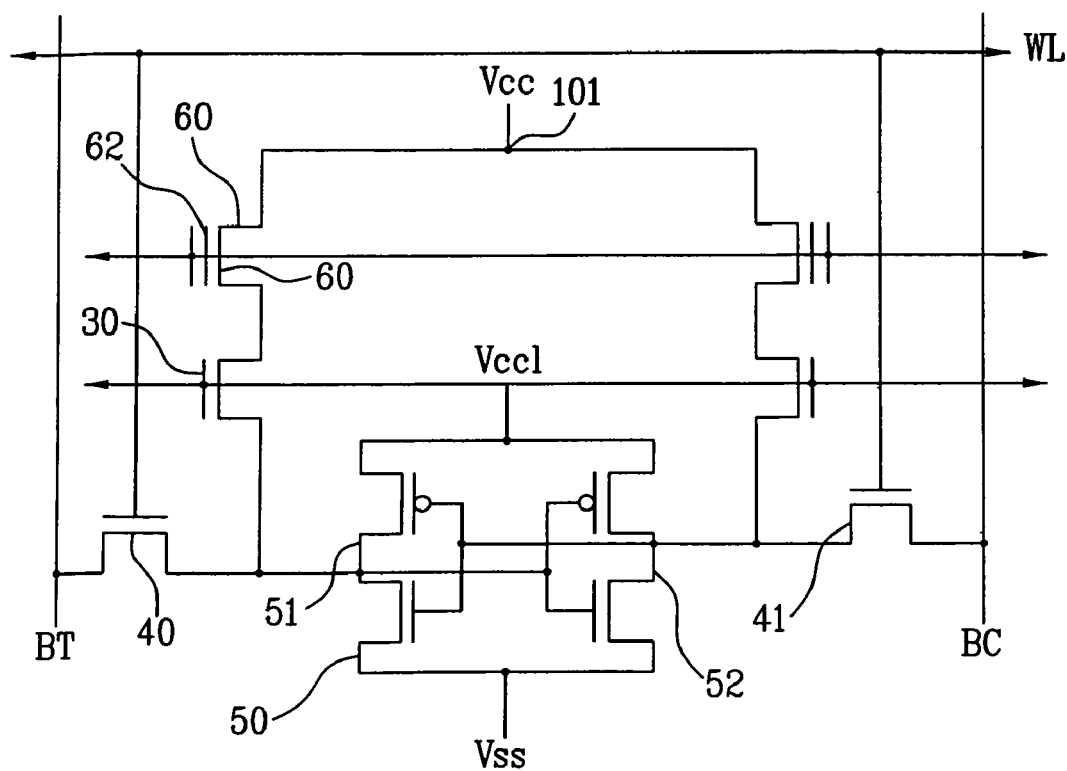
FIG. 2 is a circuit diagram of a non-volatile memory device according to the present invention.

FIG. 2 is a circuit diagram of a non-volatile memory device according to the present invention.

Referring to FIG. 2, a non-volatile memory device, e.g., nvSRAM (non-volatile static random access memory), according to the present invention is provided an electronic device having a logic circuit.

The non-volatile memory device according to the present invention includes a SRAM latch 50 having four transistors 51 and 52 to be controlled by a logic circuit (which optionally may be the control circuit of FIG. 4), pass gates 40 and 41 reading/writing a high/low state formed in the SRAM latch 50, a SONOS (silicon-oxide-nitride-oxide-silicon) transistor 60 electrically connected to a Vcc node 101 of the electronic device to store the high/low state of the SRAM latch 50 according to a turn-on or turn-off state of power, and a pass transistor 30 controlling read, program, and erase operations of the SONOS transistor 60.

Namely, the present invention is characterized in that the pass transistor 30 controls the read, program, and erase operations of the SONOS transistor 60 without employing the related art recall transistor in the memory cell.

By arranging the device in this manner, a degree of integration of the non-volatile memory device can be raised primarily because the recall transistor is removed from the memory cell, whereby the electronic device is relieved from a memory operation load owing to the recall transistor.

When the electronic device performs a series of operations, the logic circuit of the corresponding electronic device applies a first voltage, preferably a ground voltage (0V), to gate electrodes of the SONOS and pass transistors 60 and 30 while the Vcc node 101 is floated.

Under the above bias condition, both of the SONOS and pass transistors 60 and 30 having the ground voltage applied thereto are turned off. The SONOS transistor 60 is naturally isolated from the SRAM latch 50 so as to not affect a state of the SRAM latch 50.

In case the electronic device stops operating by the power being cut-off, the logic circuit applies a negative voltage, e.g., (−)10V~(−)15V, to the SONOS transistor 60 and the ground voltage to the pass transistor 30 for about 10 seconds while the Vcc node 101 is floated. The Vcc node made to be floated by the use of a control transistor (see FIG. 4) that isolates the power supply capacitor from the memory cell, so Vcc at the memory cell floats, and is not provided with the residual voltage present on the capacitor. As an alternative, the control transistor of FIG. 4 may be included at node 101 so only one control transistor is needed per memory cell (as opposed to two pass transistors in the conventional device of FIG. 1).

In this case, the negative voltage applied to the SONOS transistor 60 varies according to an erase speed of the SONOS transistor 60, an erase time of the SONOS transistor 60, an ONO (oxide-nitride-oxide) layer structure 62 of the SONOS transistor 60, and the like.

Under the above bias condition, the pass transistor 30 having the ground voltage applied thereto remains in the turned-off state and the SONOS transistor having the negative voltage applied thereto is switched to a hole accumulation mode. Hence, an electric field caused by the voltage applied to the gate electrode of the SONOS transistor 60 can be mostly concentrated on the ONO layer 62 of the SONOS transistor 60.

In doing so, electrodes trapped within the ONO layer 62 of the SONOS transistor 60 performs tunneling through a tunnel oxide layer to be drained to the substrate 61 under the SONOS transistor 60. Hence, the SONOS transistor 60 can sustain a low threshold voltage (i.e., erase mode).

Once the threshold voltage of the SONOS transistor 60 is lowered, the logic circuit applies a positive voltage, e.g., (+)10V~(+)15V, to the SONOS transistor 60 and a positive voltage to the pass transistor 30 for about 10 seconds while the Vcc node 101 is floated. In this case, the positive voltage applied to the pass transistor 30 is a voltage set to a high state, e.g., about 2.5V, by the logic circuit.

In doing so, the positive voltage applied to the SONOS transistor 60 varies according to a program speed of the SONOS transistor 60, a program time of the SONOS transistor 60, the ONO (oxide-nitride-oxide) layer structure 62 of the SONOS transistor 60, and the like.

Under the above condition, assuming the transistors 51 arranged in a left part of the SRAM latch 50 are in a high state, the left pass transistor 30 electrically connected to the transistors 51 faces a situation that a voltage difference of its gate and source is almost 0V to stay in a turn-off state. Hence, the substrate 61 of the left SONOS transistor 60 is in deep depletion mode by the positive voltage applied to the SONOS transistor 60.

Of course, an electric field generated by the positive voltage applied to the left SONOS transistor 60 is mostly caught on the depletion area of the substrate 61, whereby the ONO layer 62 of the left SONOS transistor 60 is almost not affected by the electric field. Hence, electrons are not trapped in the corresponding ONO layer 62 during a prescribed time, e.g., 1~100 msec, until the depletion mode of the substrate 61 is released.

In brief, the SONOS transistor 60 connected to a high area of the SRAM latch 50 sustains a low threshold voltage state (i.e., erase mode) as the electron trapping operation is suppressed by the depletion area formed in the substrate 61.

On the contrary, under the above condition, assuming that the transistors 52 arranged in a right part of the SRAM latch 50 are in a high state, the right pass transistor 30 electrically connected to the transistors 52 faces a situation that a voltage difference of its gate and source is in a high state and is then switched to a turn-on state. Hence, the electric field generated by the positive voltage applied to the right SONOS transistor 60 is mostly caught on the ONO layer 62 of the right SONOS transistor 60. As a result, electrons gathering in the substrate 61 of the corresponding SONOS transistor 60 performs tunneling through the tunnel oxide layer to be quickly trapped in the ONO layer 62.

In brief, the SONOS transistor 60 connected to a low area of the SRAM latch 50 is able to quickly trap the electrons gathering in the substrate 61, thereby sustaining a high threshold voltage state (i.e., program mode).

Consequently, after completion of the aforesaid procedures, the SONOS transistor 60 can stably store the high/low state stored in the SRAM latch 50.

Meanwhile, in case that the operation of the electronic device is re-initiated by a power supply, the logic circuit applies the ground voltage to the SONOS transistor 60, a positive voltage to the pass transistor 30, and a positive voltage to the Vcc node 101. In doing so, the positive voltage applied to the pass transistor 30 or the Vcc node 101 means the voltage, e.g., 2.5V, is set to high state by the logic circuit.

Under the above bias condition, when both of the left and right pass transistors 30 are turned on, current applied to the Vcc node 101 can flow in the pass transistor 30 since the left SONOS transistor 60 was in the erase mode, i.e., since the left SONOS transistor 60 has sustained the low threshold voltage. Yet, the current applied to the Vcc node 101 cannot flow in the pass transistor 30 since the right SONOS transistor 60 was in the program mode, i.e., since the right SONOS transistor 60 has sustained the high threshold voltage.

Consequently, according to the above-explained operations of the SONOS transistors 60, in the SRAM latch 50 electrically connected to the pass transistors 30, the left and right parts of the SRAM latch 50 naturally lie in the high and low states, respectively. Even though the electronic device was turned off, the SRAM latch 50 can stably recall its originally stored data.

Therefore, the non-volatile memory device according to the present invention can normally perform its data storage function without employing the related art recall transistors.

FIG. 3 is a table for explaining a method of driving a non-volatile memory device according to the present invention.

Referring to FIG. 3, various operational conditions for the non-volatile memory device according to the present invention are shown.

Figure 1:
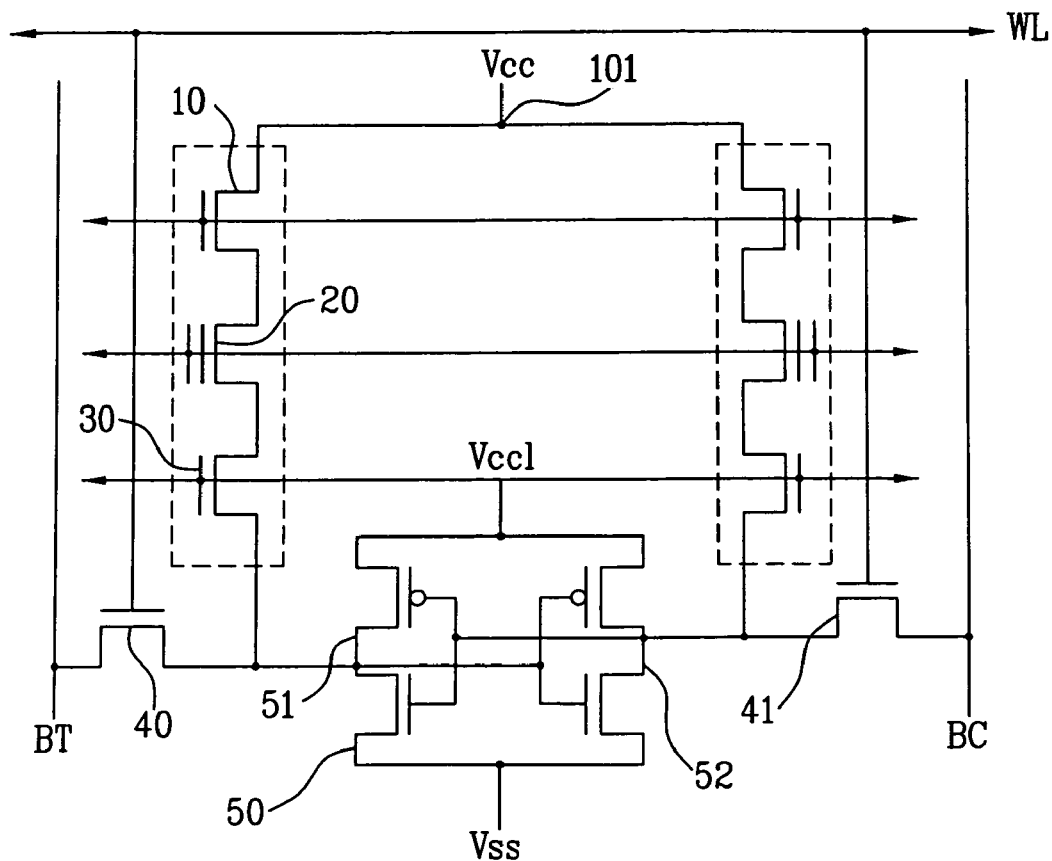
FIG. 1 is a circuit diagram of a non-volatile memory device according to a related art.
Figure 4:
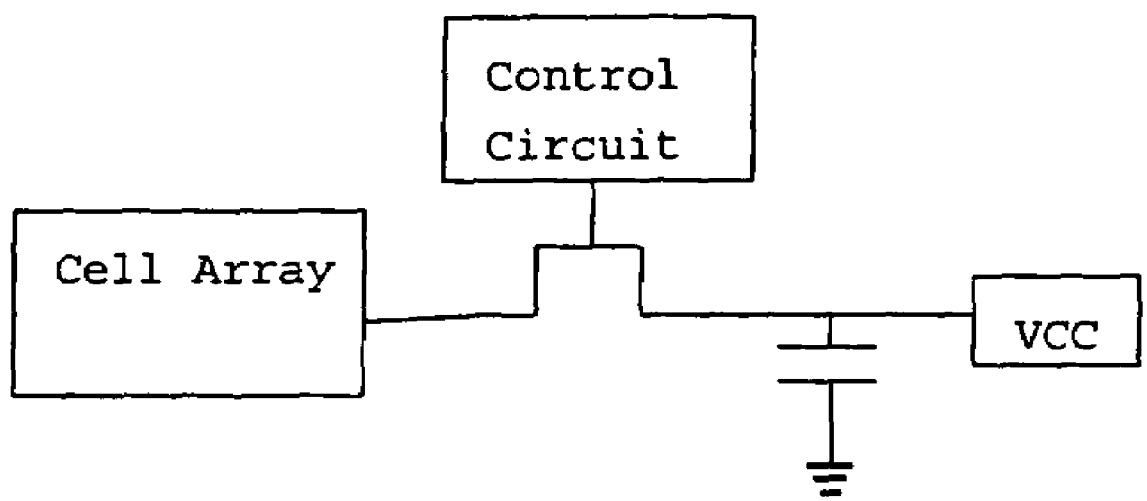
FIG. 4 is a block diagram on an embodiment of the present invention, showing a transistor switch that isolates a capacitor from a memory cell array, and thus avoiding the need to include even on recall transistor in each memory cell.

FIG. 4 is a block diagram showing a transistor controlled by a control circuit, which isolates the memory cell from Vcc and a power supply capacitor, as shown. When the control circuit controls the transistors to stop current flow to the memory cell, the Vcc node within the memory cell (FIG. 2) is left to be floating. As previously discussed, the transistor of FIG. 4 may be included at node 101 within the memory cell. An advantage with having the transistor outside of the memory cell is that the degree of integration of the memory cell is greatly enhanced by reducing the number of transistors in the cell to 10, as compared to 12 in the conventional device (FIG. 1). Likewise, even if the control transistor is placed at node 101, the number of transistors in the cell is 11, which is 1 less than the 12 used in the conventional device.

Accordingly, in the present invention, a voltage bias condition enables an electronic device to normally operate without employing a specific transistor, e.g., a recall transistor is proposed so that the non-volatile memory device can perform its function normally without the recall transistor.

Therefore, a degree of cell integration can be considerably raised.

Moreover, the present invention relieves the electronic device from a memory operation load.

This application claims the benefit of Korean Application No. P2003-0101950 filed on Dec. 31, 2003, which is hereby incorporated by reference in its entirety.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A non-volatile memory device, which is provided within an electronic device having a logic circuit, the non-volatile memory device comprising:

a SRAM latch contained in a memory cell controlled by the logic circuit;

a SONOS, silicon-oxide-nitride-oxide-silicon, transistor disposed within the memory cell and electrically connected via a first terminal directly to a Vcc node of the electronic device, without a recall transistor connected therebetween, and configured to store a high/low state of the SRAM latch according to a turn-on or turn-off state of power of the electronic device;

a pass transistor disposed in the memory cell between the SRAM latch and the SONOS transistor and configured to control read, program, and erase operations of the SONOS transistor, wherein a first pass transistor terminal connected to a second SONOS terminal, and a second pass transistor terminal connected to said SRAM latch; and a switch mechanism configured to controllably place said Vcc node in and out of a floating state depending on the operation being performed by said pass transistor.

2. The device of claim 1, wherein, the switch mechanism includes a transistor and a control circuit, said control circuit configured to controllably set said transistor in a non-conducting state when setting the Vcc node in the memory cell in the floating state.

3. A method of driving a non-volatile memory device, which is provided within an electronic device having a logic circuit and includes a SRAM latch controlled by the logic circuit, a SONOS transistor electrically connected via a first terminal directly to a Vcc node of the electronic device without a transistor connected therebetween and configured to store a high/low state of the SRAM latch according to a turn-on or turn-off state of power of the electronic device, a pass transistor disposed between the SRAM latch and the SONOS configured to control read, program, and erase operations of the SONOS transistor, and a switch mechanism configured to controllably place a Vcc node in and out of a floating state depending on the operation being performed by said pass transistor, the method comprising the steps of:

erasing a stored charge in the transistor including
applying a negative voltage to the SONOS transistor and a first voltage to the pass transistor, and setting the Vcc node to a floating state when the electronic device is set in the turn-off state, and selectively storing the high/low state stored in the SRAM latch by applying a positive voltage to the SONOS transistor, a positive voltage to the pass transistor, and setting the Vcc node to the floating state.

4. The method of claim 3, further comprising the step of:
if the electronic device is in the turn-on state, isolating the SONOS transistor from the SRAM latch by applying the first voltage to the transistor and the pass transistor, and by floating the Vcc node.

5. The method of claim 3, further comprising the steps of if the electronic device is in the turn-off state, recalling information stored in the SONOS transistor to the SRAM latch by applying the positive voltage to the Vcc node, the first voltage to the SONOS transistor, and the positive voltage to the pass transistor.

6. The method of claim 3, wherein the first voltage is a ground voltage.

7. The method of claim 4, wherein the first voltage is a ground voltage.

8. The method of claim 5, wherein the first voltage is a ground voltage.

* * * * *